United States Patent [19]

Hobdey

[11] 3,877,131

[45] Apr. 15, 1975

[54] PRESSURE MOUNTING ASSEMBLIES

[75] Inventor: Nigel Grenville Hobdey, Lincoln, England

[73] Assignee: AEI Semiconductors Limited, Lincoln, England

[22] Filed: May 17, 1974

[21] Appl. No.: 471,002

[30] Foreign Application Priority Data

May 17, 1973 United Kingdom ............... 23470/73

[52] U.S. Cl. ............................. 29/203 B; 29/203 P

[51] Int. Cl. ........................................ H05k 13/04

[58] Field of Search ........... 29/203 P, 203 R, 203 B, 29/200 P

[56] References Cited

UNITED STATES PATENTS 3,728,769 4/1973 Judge et al. ................... 29/203 P X 3,735,466 5/1973 Jensen ............................. 29/203 B

*Primary Examiner*—Thomas H. Eager

*Attorney, Agent, or Firm*—Baldwin, Wight & Brown

[57] ABSTRACT

Electronic components which have to be mounted before use are often delicate and easily damaged by the application of an incorrect mounting pressure. The present invention provides a mounting assembly which is preset to a precise pressure value and which when used to mount an electronic component provides a positive indication when that value has been reached. A plurality of electronic components can be mounted simultaneously without significant risk of damage.

15 Claims, 3 Drawing Figures

PRESSURE MOUNTING ASSEMBLIES

Figure 1:
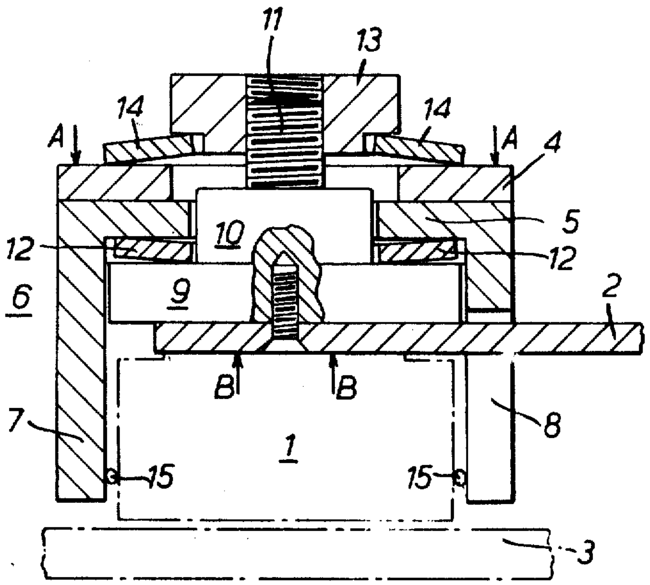

This invention relates to pressure mounting assemblies and is primarily intended for use in mounting high power electronic components on to thermal and/or electrical conductors.

In order to ensure the existence of a sufficiently good thermal and/or electrical path between a conductor and such a component it is usually necessary to provide some means for holding the two in intimate pressure contact, as the alternative of providing a permanent bond between the two, for example by means of soldering or welding, is unacceptable in many instances because of the nature of the component and/or the need to replace easily the component from time to time. In practice it is difficult to ensure that just the right degree of pressure exists between a high power electronic component and a thermal or electrical conductor. If the pressure is too low the poor thermal or electrical contact respectively may impair the satisfactory operation of the component and may even seriously damage it, whilst if the pressure is too high the component may suffer irreparable mechanical damage. In fact, for many high power electronic components the correct pressure is rather critical. The difficulty is aggravated by the fact that components are often sold for installation by a customer who, even if he takes the trouble to ascertain the correct mounting pressure, may well have no way of checking that the correct pressure is being applied. The present invention seeks to provide a pressure mounting assembly in which this difficulty is reduced.

According to this invention a pressure mounting assembly for pressure mounting an electronic component to a body includes spaced first and second reaction members with resilient means positioned therebetween and an indicating member held firmly in one position by means of pressure exerted on the reaction members by the resilient means, the arrangement being such that when the assembly is used to pressure mount the component to a body the resilient means are compressed in the mounting operation so that when a predetermined desired mounting pressure is reached the indicating member is no longer firmly held.

In use, by means of studs, screws or the like linking the first reaction member to the body, the pressure on the component may be increased until it is just equal to the predetermined pressure, at which point the indicating member is released thereby informing an operator that the component is subject to exactly the correct predetermined pressure. Generally the body is an electrical conductor, and usually a second conductor will be provided between the second reaction member and the component prior to mounting in those cases where the said second reaction member is not itself a suitable conductor.

Preferably the indicating member and the resilient member are situated on mutually opposite sides of the first reaction member, the movement associated with the deformation of the resilient member being coupled to the indicating member via a rigid mechanical coupling passing through an aperture in the said first reaction member.

Preferably the rigid mechanical coupling is provided with an adjustment to make up excessive movement of the indicating member when said resiliently deformable member is subject to a force of said predetermined value.

In one embodiment of this invention the said first reaction member consists of the base portion of an inverted cup, the side walls of which, in use, partially surround a component to be mounted, and the said rigid coupling consists of a screw-threaded stud secured at its base to the said second member, and carrying a co-operating screw-threaded nut, movement of which provides the said adjustment.

In this said one embodiment the said first member may be composed of an electrically insulative plastics material, and where there is so, preferably a metallic pressure pad is positioned between the said indicating member and the said first member. Preferably again said metallic pad is an annular washer which is spaced apart from, and encircles, said stud.

To assist in mounting, a resilient pliable member may be employed to retain a component in position within the side walls of the said inverted cup whilst the mounting pressure is being applied, after which, if desired, the resilient pliable member may remain in position, or may be discarded.

In another embodiment of this invention the first reaction member consists of an annular member having a lip portion to engage said resiliently deformable member, and said rigid coupling consists of a screw-threaded stud secured to said first reaction member and carrying a co-operating screw-threaded member, movement of which provides said adjustment.

Preferably the first said reaction member is also secured to said stud by a screw-thread.

In another embodiment of this invention the pressure mounting assembly is arranged to permit simultaneous mounting of a plurality of components, and includes an elongate first reaction member having a plurality of apertures spaced along its length, a different rigid coupling member passing through each aperture to provide coupling between a respective one of a plurality of second reaction members, all positioned to one side of the first reaction member, and a plurality of respective indicating members positioned to the other side of the first reaction member, each indicating member being retained in position by the head of an adjustable screw-threaded stud secured to a co-operating screw-threaded portion of a respective second reaction member.

The said other embodiment may be used to mount components in a plurality of pairs, one above the other with an additional electrical conductor positioned between the two components in each pair.

In either of the two said embodiments the said indicating member, or indicating members (as the case may be) may conveniently consist of an annular washer surrounding the stud forming part of the rigid coupling. The washer may be a flat, rigid washer, or alternatively may be a resiliently deformable dished washer.

According to another aspect of this invention a component assembly consists of a component, or components (as the case may be), mounted to a body by a pressure mounting assembly arranged as aforesaid.

Figure 2:
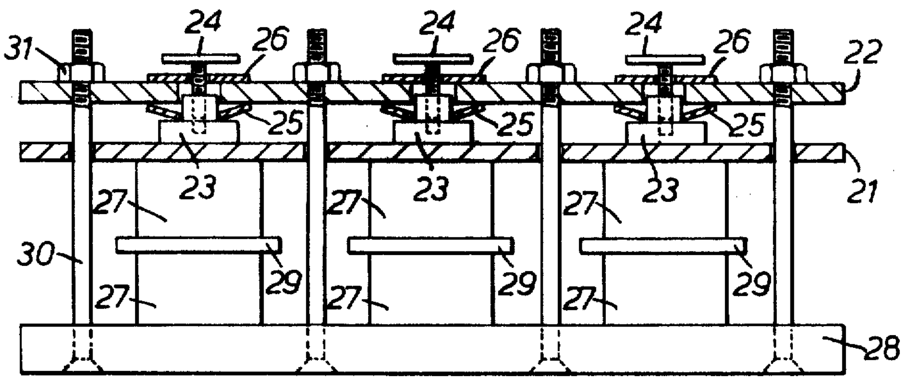
Figure 3:
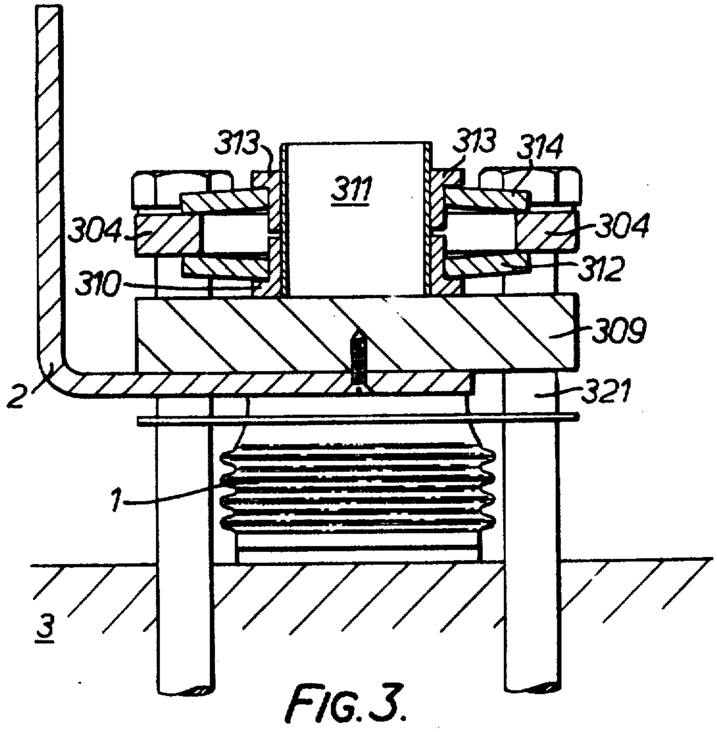

The invention is further described, by way of example, with reference to the accompanying drawings in which:

FIGS. 1 and 2 show, in section, two embodiments of pressure mounting assemblies in accordance with the present invention, and with reference to the accompanying drawing which is referred to as FIG. 3, and which shows, also in section, a pressure mounting assembly in accordance with the present invention.

FIG. 1 shows a pressure mounting assembly suitable for mounting a single high power electronic component 1, such as a thyristor or a rectifier, in contact with a pair of conductors 2, 3, conductor 2 being primarily just an electrical conductor, whereas conductor 3 is both an electrical conductor and a thermal conductor. Conductor 3 is hollow to permit passage of a coolant therethrough. The component 1 and the conductor 3 are shown in broken line since they do not really form part of the pressure mounting assembly.

The pressure mounting assembly consists of a reaction member which in FIG. 1 is constituted by the combination of an annular plate 4 and the top platform 5 of a moulded housing 6 which is provided with four sidewalls, the two sidewalls of which are illustrated being referenced 7 and 8. A contact member 9, which in this case is a solid circular plate, is mounted on the underside of the top platform 5. The contact member 9 is held in place by a mechanical coupling consisting of a base 10 and stud 11 which are formed integrally with the contact member 9 and which pass through aligned apertures in the top platform 5 and the annular plate 4. Interposed between the contact member 9 and the top platform 5 is an annular resiliently deformable spring washer 12, dished as shown. Positioned between a screw-threaded nut 13, which is mounted on the stud 11, and the annular plate 4 is an indicator member 14, which in this case is an annular resiliently deformable spring washer, dished as shown.

The electrical conductor 2 is screw mounted to the underside of the contact member 9. Sidewall 8 is slotted to allow passage of the conductor 2 through the housing 6.

The pressure mounting assembly is initially assembled as shown, but in the absence of the component 1 and the conductor 3. At this stage the nut 13 is merely screwed loosely onto stud 11. The resilient washer 12 is then deformed by means of pressure applied between points designated by the arrows A and B. Conveniently the assembly may be inserted in a suitable hydraulic press for this purpose in which a precisely predetermined pressure can be maintained. Whilst this pressure is maintained nut 13 is screwed down into loose contact with the indicator member 14 until the indicator member is only just rotatable without any excess or free play in a vertical direction. The pressure mounting assembly is removed from the press and the pressure is then shared equally by the resilient washer 12 and the indicator member 14.

In use, a component 1 is inserted into the housing 7, and is retained there by a flexible 'O' ring 15. In practice the pressure mounting assembly and the component will often be supplied separately for a customer to mount on a conductor of his choice. The pressure mounting assembly and component 1 are mounted onto conductor 3 and are secured there by means of long studs (not shown) passing through the annular plate 4, the top platform 5 of the housing 6 and the conductor 3. In this case four such studs are used, one at each corner of the housing 6.

These studs are tightened down evenly and in so doing the resilient washer 12 is increasingly deformed, whereas the pressure on the indicator member 14 steadily reduces until the indicator member 14 is just released by the nut 13. At this point the pressure on the component 1 is exactly equal to the pressure originally applied by the press. It will be appreciated that the sidewalls of the housing 6 are dimensioned such that a spacing remains between the base of the housing and the conductor 3. Conductor 3 is made hollow to allow passage of a coolant therethrough to improve its thermal conduction properties.

FIG. 2 shows an embodiment in which six components can be mounted in a very compact manner whilst being subject to a precisely predetermined mounting pressure. In this embodiment the pressure mounting assembly consists of a single contact member 21, a reaction plate 22, three pads 23, and, associated with each pad 23, a mechanical coupling consisting of a short stud 24 which passes through an aperture in this reaction plate 22. Interposed between each pad 23 and the reaction plate 22 is an annular resiliently deformable washier 25, and interposed between the head of each stud 24 and the reaction plate 22 is an indicator member 26 in the form of a plain rigid annular washer.

Initially (in the absence of any of the components 27) pressure is applied so as to urge the pressure pads 23 towards the reaction plate 22, thereby deforming the resilient washer 25. When the correct predetermined pressure is applied, studs are screwed down onto the indicator members 26, to take up any vertical play, but such that the indicator members are just capable of rotational movement. The pressure is then released.

When it is desired to use the pressure mounting assembly, six components 27 are placed on a conductor 28, an additional conductor 29 being placed between each pair of components 27. Each conductor 28 and 29 may be hollow so as to allow passage of a coolant. The contact member 21 acts as a conductor and may also be hollow. Each conductor is electrically conductive as well as being thermally conductive, since its prime purpose is to provide a high current connection to the ends of each component. Thus in practice each component 27 is provided with a conductive end face for this purpose. Four studs 30 and nuts 31 are provided and these are progressively tightened until the indicator members 26 just release. At this point the components 27 are subject to the correct pressure, and if desired the studs 24 and indicating members 26 may be removed from the pressure mounting assembly and discarded.

Referring to FIG. 3, there is shown therein a pressure mounting assembly which is similar in principle to that shown in FIG. 1, but in which the structural components are simplified so as to reduce the cost of the assembly and make it more applicable to mass-production methods of construction.

As with the assembly shown in FIG. 1, an electronic component 1 is mounted between a pair of conductors 2, 3. Conductor 2 is primarily an electrical conductor whereas conductor 3, in addition to providing electrical contact constitutes a relatively massive body which acts also as a heat sink.

The pressure mounting assembly consists of a first reaction member, which in this case is an apertured plate 304; an annular resiliently deformable spring washer 312 dished as shown and an indicator member, which is also an annular resiliently deformable spring washer 314 also dished as shown. The washer 312 and 314 are secured to the plate 304 by screw-threaded annular members 313 and 310 which engage opposite ends of a screw-threaded stud 311 which passes through the aperture of the plate 304. Member 310 constitutes the aforesaid second reaction member. Each member 313 and 310 is provided with a lip which engages the inner rim of washers 312 and 314.

The lower face of the annular member 310 is held against an electrically insulating block of material 309, to the underside of which is mounted the conductor 2 by means of a screw 320. The component 1 is firmly held between the underside of the conductor 2 and the conductor 3 by the action of four studs 321 (only two of which appear in the sectional view shown in FIG. 3) which pass through the plate 304 and enter screw-threaded recesses in the conductor 3.

The operation of this pressure mounting assembly will be clearly understood by analogy with that shown in FIG. 1. In this case the washer 310 is initially compressed to a required pressure by squeezing together the member 310 and the plate 304, and at the same time the member 313 is screwed-down on the stud 311 until the lip of the member 313 lightly engages the inner rim of washer 314. On removing the compression force the washer 314 is tightly gripped between the plate 304 and the member 313.

In use, with a component 1 in position the studs 321 are tightened down until the washer 313 is just released, and when this point is reached it is known the pressure applied to the component 1 is exactly equal to the required pressure.

I claim:

1. A pressure mounting assembly for pressure mounting an electronic component to a body including spaced first and second reaction members with resilient means positioned therebetween and an indicating member held firmly in one position by means of pressure exerted on the reaction members by the resilient means, mounting means for causing compression of said resilient means whilst said component is being mounted, said compression releasing said indicating member from its said firmly held position when a predetermined desired mounting pressure is reached.

2. An assembly as claimed in claim 1 wherein the indicating member and the resilient member are situated on mutually opposite sides of the first reaction member, the movement associated with the deformation of the resilient member being coupled to the indicating member via a rigid mechanical coupling passing through an aperture in the said first reaction member.

3. An assembly as claimed in claim 2 wherein the rigid mechanical coupling is provided with an adjustment to take up excessive movement of the indicating member when said resiliently deformable member is subject to a force of said predetermined value.

4. An assembly as claimed in claim 2 wherein said first reaction member consists of the base portion of an inverted cup, the side walls of which, in use, partially surround a component to be mounted, and the said rigid coupling consists of a screw-threaded stud secured at its base to the said second member, and carrying a cooperating screw-threaded nut, movement of which provides the said adjustment.

5. An assembly as claimed in claim 4 wherein said first member is composed of an electrically insulative plastics material.

6. An assembly as claimed in claim 5 wherein a metallic pressure pad is positioned between the said indicating member and the said first member.

7. An assembly as claimed in claim 6 wherein said metallic pad is an annular washer which is spaced apart from, and encircles, said stud.

8. An assembly as claimed in claim 1 wherein the first reaction member consists of an annular member having a lip portion to engage said resiliently deformable member, and said rigid coupling consists of a screw-threaded stud secured to said first reaction member and carrying a co-operating screw-threaded member, movement of which provides said adjustment.

9. An assembly as claimed in claim 8 wherein the first reaction member is also secured to said stud by a screw-thread.

10. An assembly as claimed in claim 1, wherein the pressure mounting assembly is arranged to permit simultaneous mounting of a plurality of components, and includes an elongate first reaction member having a plurality of apertures spaced along its length, a different rigid coupling member passing through each aperture to provide coupling between a respective one of a plurality of second reaction members, all positioned to one side of the first reaction member, and a plurality of respective indicating members positioned to the other side of the first reaction member, each indicating member being retained in position by the head of an adjustable screw-threaded stud secured to a co-operating screw-threaded portion of a respective second reaction member.

11. An assembly as claimed in claim 10 wherein the portion of said rigid coupling which passes through each aperture comprises said stud.

12. An assembly as claimed in claim 4 wherein said indicating member consists of an annular washer surrounding the stud forming part of the rigid coupling.

13. An assembly as claimed in claim 12 wherein said washer which comprises said indicating member is a resiliently deformable dished washer.

14. An assembly as claimed in claim 11 wherein said indicating members each consist of an annular washer surrounding the stud forming part of the rigid coupling.

15. An assembly as claimed in claim 14 wherein said washer which comprises said indicating member is a resiliently deformable dished washer.

* * * * *